US009263121B2

(12) United States Patent
Karl et al.

(10) Patent No.: US 9,263,121 B2

(45) Date of Patent: Feb. 16, 2016

(54) LOW POWER TRANSIENT VOLTAGE COLLAPSE APPARATUS AND METHOD FOR A MEMORY CELL

(71) Applicants: Eric A. Karl, Portland, OR (US); Yong-Gee Ng, Hillsboro, OR (US); Cyrille Dray, Hillsboro, OR (US)

(72) Inventors: Eric A. Karl, Portland, OR (US); Yong-Gee Ng, Hillsboro, OR (US); Cyrille Dray, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 99 days.

(21) Appl. No.: 13/976,403

(22) PCT Filed: May 16, 2013

(86) PCT No.: PCT/US2013/041412

§ 371 (c)(1),
(2) Date: Jun. 26, 2013

(87) PCT Pub. No.: WO2014/185923

PCT Pub. Date: Nov. 20, 2014

(65) Prior Publication Data

US 2014/0340977 A1 Nov. 20, 2014

(51) Int. Cl.

| | |
|---|---|
| ***G11C 5/14*** | (2006.01) |
| ***G11C 11/419*** | (2006.01) |
| ***G11C 11/417*** | (2006.01) |
| *G11C 11/414* | (2006.01) |
| *G11C 11/413* | (2006.01) |

(52) U.S. Cl.

CPC .............. *G11C 11/419* (2013.01); *G11C 5/147* (2013.01); *G11C 11/417* (2013.01); *G11C 11/413* (2013.01); *G11C 11/414* (2013.01)

(58) Field of Classification Search

CPC ...... G11C 5/14; G11C 11/414; G11C 11/413; G11C 11/4074; H03K 3/3565

USPC .......................................... 365/194, 227, 291

See application file for complete search history.

(56) References Cited

U.S. PATENT DOCUMENTS

| | | | | |
|---|---|---|---|---|
| 6,870,413 | B1 * | 3/2005 | Chang et al. | 327/205 |
| 7,167,032 | B1 | 1/2007 | Barlow | |
| 7,289,377 | B2 * | 10/2007 | Do | 365/189.09 |
| 7,542,332 | B1 | 6/2009 | Kim | |
| 8,305,829 | B2 * | 11/2012 | Chan et al. | 365/228 |
| 8,829,964 | B1 * | 9/2014 | Williams et al. | 327/206 |
| 2003/0137331 | A1 * | 7/2003 | Hirose | 327/205 |
| 2003/0189869 | A1 | 10/2003 | Yamagata et al. | |
| 2006/0091937 | A1 * | 5/2006 | Do | 327/538 |
| 2010/0214863 | A1 * | 8/2010 | Chan et al. | 365/228 |
| 2011/0285310 | A1 | 11/2011 | Leinen | |

OTHER PUBLICATIONS

Notification of Transmittal of the International Search Report and Written Opinion of the International Searching Authority issued for International Patent Application No. PCT/US2013/041412, mailed Jan. 30, 2014, 7 pages.

* cited by examiner

*Primary Examiner* — Han Yang

*Assistant Examiner* — Xiaochun L Chen

(74) *Attorney, Agent, or Firm* — Blakely, Sokoloff, Taylor & Zafman LLP

(57) ABSTRACT

Described is an apparatus for memory write assist which consumes low power during write assist operation. The apparatus comprises: a power supply node; a device operable to adjust voltage on the power supply node; and a feedback unit coupled to the power supply node, the feedback unit to control the device in response to a voltage level of the voltage on the power supply node.

19 Claims, 7 Drawing Sheets

100

Vcc
Logic 103
Write Assist
Fb control
Vcc
Power supply local node
Feedback Unit 102
Power supply node
SRAMVcc
Memory Cell(s) 104
Device control
Vcc
Device 101

500
Volt
Time
Wordline (from Vss to VWL and back to Vss)
SRAMVcc for various settings of Fb Control
520
Current
Time
Substantially zero cross-over current

LOW POWER TRANSIENT VOLTAGE COLLAPSE APPARATUS AND METHOD FOR A MEMORY CELL

CLAIM OF PRIORITY

This application claims the benefit of priority of International Patent Application No. PCT/US2013/041412 filed May 16, 2013, titled "Low Power Transient Voltage Collapse Apparatus and Method for a Memory Cell," which is incorporated by reference in its entirety.

BACKGROUND

In scaled technologies, the increasing levels of integration and process variation on minimum-sized devices in memory cells makes it challenging to maintain memory cell stability and write margin concurrently. Write margin can be enhanced by collapsing the power supply to the memory cell during write operation. In such a method, power supply voltage coupled to memory cells is reduced to weaken the strength of p-type transistors of the written memory cell to enhance write margin.

However, in partially selected cells along a column of memory cells, which are being written to, the state of the memory cells is maintained during the power supply collapse operation. The retention characteristics of these partially selected memory cells sets constraints on the duration and depth of power supply collapse, and are a technology sensitive metric that is difficult to predict at design time during technology development.

Currently, known methods of power supply collapse significantly increase Vcc-Vss cross-over current (current from power supply to ground), which is an impediment for low power designs. In low frequency cases where the collapsed voltage may need to stay at the suppressed level for an extended time, this cross-over current can increase the overall write power consumption by up to 2× in SRAMs (Static Random Access Memories).

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figure 1:
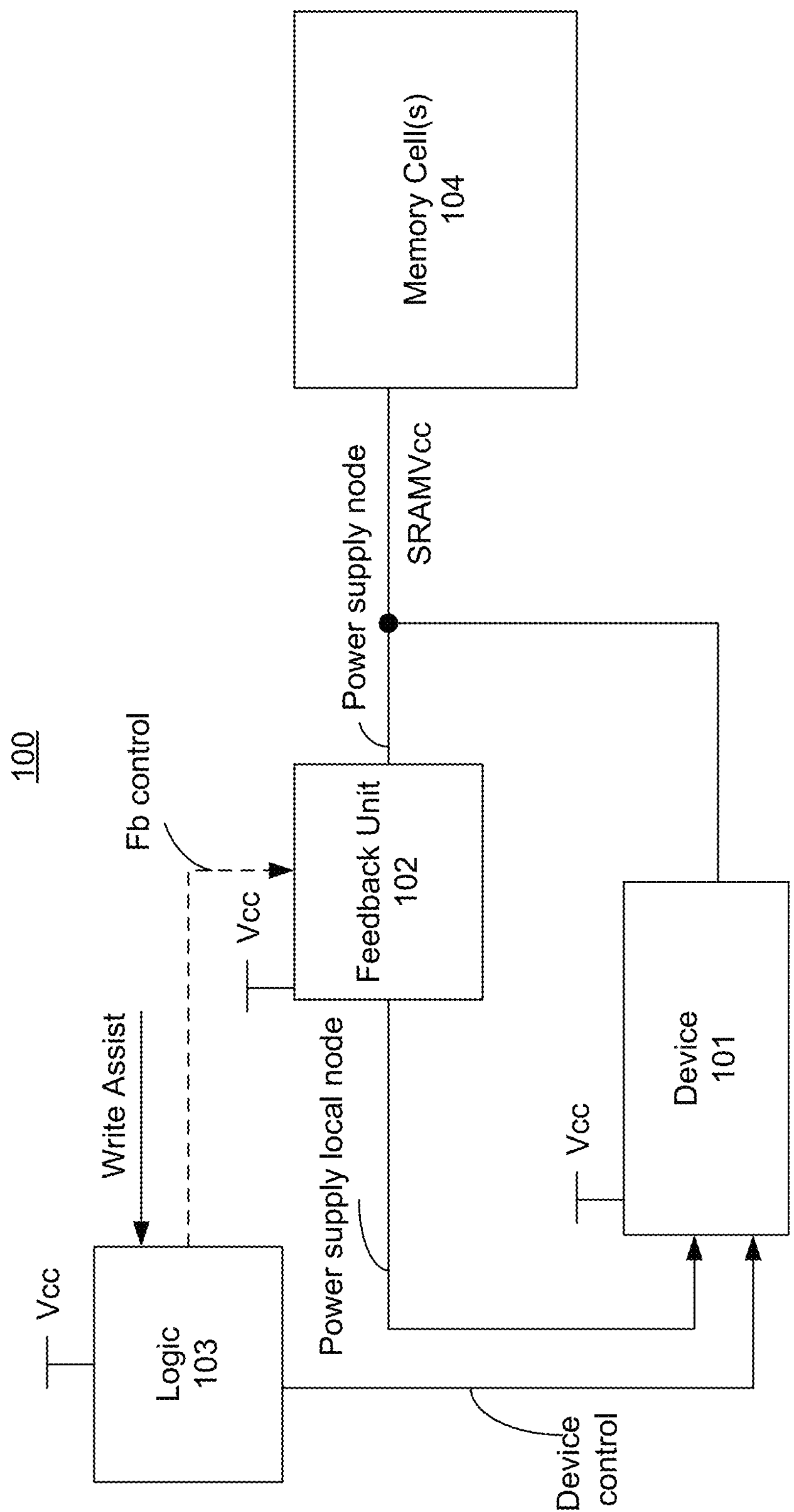
FIG. 1 is high level architecture of adjusting power supply to memory cell(s) during write operation, according to one embodiment of the disclosure.

The embodiments disclose power supply collapse circuits to assist write operation in memory cell(s) such that cross-over current consumption by the power supply collapse circuits is reduced while providing tunable power supply collapse voltage levels. One technical effect of the embodiments is that cross-over current consumption reduces (e.g., by 40%) over traditional voltage collapse circuits. In one embodiment, a feedback mechanism is used to control a pull-down device when the collapsed power supply reaches its desired voltage level. In such an embodiment, when the collapsed power supply reaches its desired voltage level, the power supply node is allowed to float. The embodiments provide a self-terminating collapse or a self-timed mechanism to terminate the discharge of the power supply line. In one embodiment, the self-timed mechanism guarantees that voltage collapse power supply node lands to a pre-determined floor.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct electrical connection between the things that are connected, without any intermediate devices. The term "coupled" means either a direct electrical connection between the things that are connected or an indirect connection through one or more passive or active intermediary devices. The term "circuit" means one or more passive and/or active components that are arranged to cooperate with one another to provide a desired function. The term "signal" means at least one current signal, voltage signal or data/clock signal. The meaning of "a," "an," and "the" include plural references. The meaning of "in" includes "in" and "on."

The term "scaling" generally refers to converting a design (schematic and layout) from one process technology to another process technology. The term "scaling" generally also refers to downsizing layout and devices within the same technology node. The terms "substantially," "close,"

"approximately," "near," "about," etc., generally refer to being within +/−20% of a target value.

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For purposes of the embodiments, the transistors are metal oxide semiconductor (MOS) transistors, which include drain, source, gate, and bulk terminals. The transistors also include Tri-Gate and FinFet transistors. Source and drain terminals may be identical terminals and are interchangeably used herein. Those skilled in the art will appreciate that other transistors, for example, Bi-polar junction transistors—BJT PNP/NPN, BiCMOS, CMOS, eFET, etc., may be used without departing from the scope of the disclosure. The term "MN" indicates an n-type transistor (e.g., NMOS, NPN BJT, etc.) and the term "MP" indicates a p-type transistor (e.g., PMOS, PNP BJT, etc.).

FIG. 1 is high level architecture 100 of adjusting power supply to memory cell(s) during write operation, according to one embodiment of the disclosure. In one embodiment, architecture 100 comprises: device 101, feedback unit 102, logic 103, and memory cell(s) 104.

In one embodiment, device 101 is operable to adjust voltage on Power supply node. In one embodiment, device 101 includes a transistor which is coupled to Power supply node and Power supply local node. In one embodiment, the transistor of device 101 is at least one of p-type transistor or n-type transistor. For example, when the transistor of device 101 is an n-type transistor, it is used to pull-down the voltage level on Power supply node during write operation.

In one embodiment, feedback unit 102 is coupled to Power supply node and device 101. In one embodiment, feedback unit 102 comprises a circuit with hysteresis. One such embodiment of a circuit is described with reference to FIGS. 2-5. In one embodiment, the circuit with hysteresis is a Schmitt-Trigger which includes a device which is operable to adjust tripping point of the Schmitt-Trigger.

Referring back to FIG. 1, in one embodiment, feedback unit 102 comprises a capacitor or wire. One such embodiment is described with reference to FIGS. 6-7. In one embodiment, the capacitor is at least one of a metal capacitor, device capacitor, or a hybrid capacitor including a metal capacitor and a device capacitor.

In one embodiment, logic 103 is used to enable or disable device 101 according to the Write Assist signal using Device control signal. In one embodiment, logic 103 generates Fb (feedback) control signal for controlling the behavior of feedback unit 102. For example, logic 103 may adjust tripping point of hysteresis circuit using the Fb control signal. In one embodiment, memory cell(s) 104 comprises SRAM cells. In one embodiment, SRAM cells are 6T cells. In one embodiment, SRAM cell is implemented as 4T, 5T, or 8T, etc. In one embodiment, during write operation, power supply (also called SRAMVcc) on Power supply node is collapsed from Vcc level to a level between ground and Vcc by circuit 100 to assist with write operation while consuming substantially zero cross-over current. In such an embodiment, after write operation is over, SRAMVcc is raised back to its normal level (e.g., Vcc).

Figure 2:
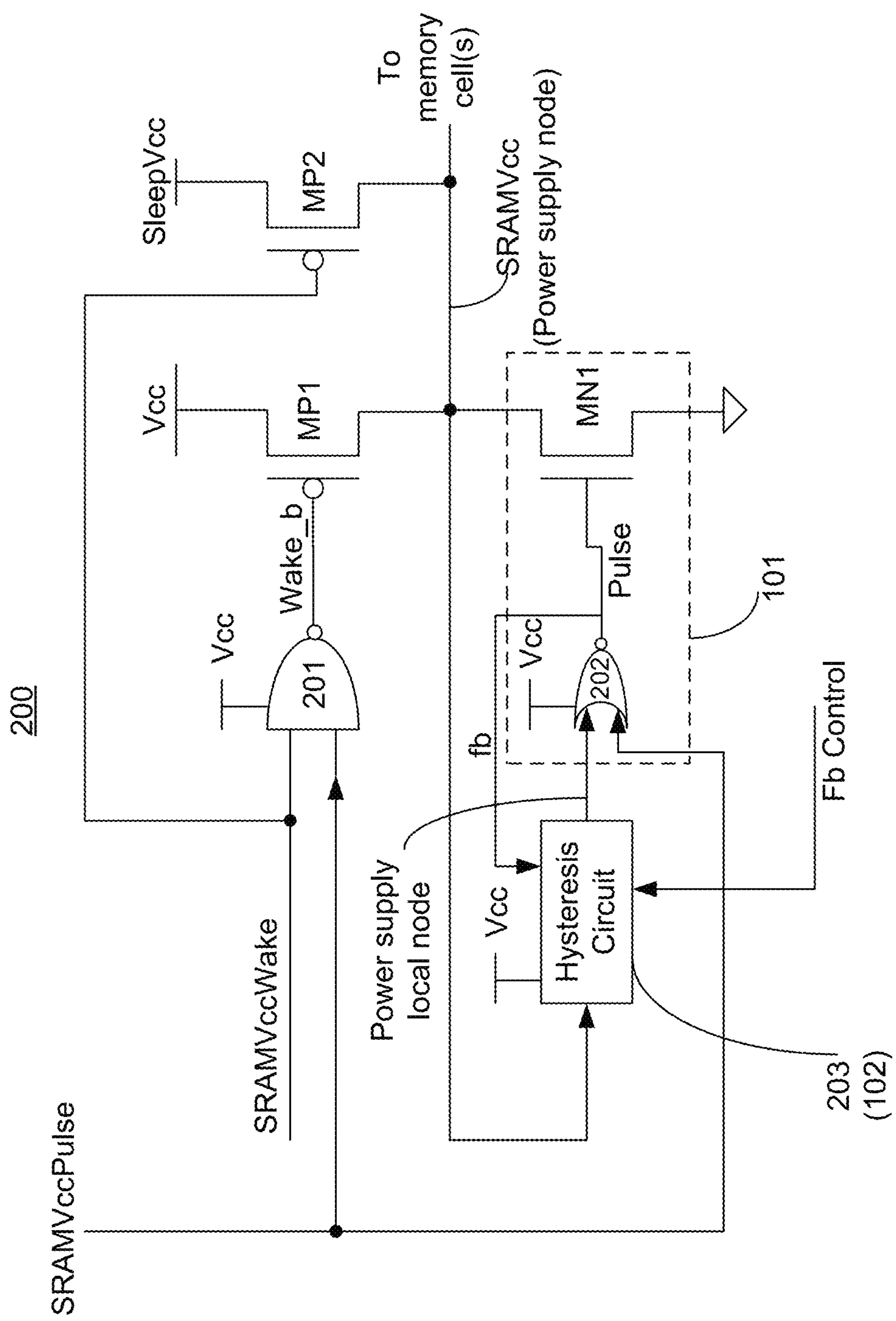
FIG. 2 is a circuit implementation of hysteresis based architecture for adjusting power supply to memory cell(s) during write operation, according to one embodiment of the disclosure.

FIG. 2 is a circuit implementation of hysteresis based architecture 200 for adjusting power supply to memory cell(s) during write operation, according to one embodiment of the disclosure. It is pointed out that those elements of FIG. 2 having the same reference numbers (or names) as the elements of any other figure can operate or function in any manner similar to that described, but are not limited to such.

In one embodiment, architecture 200 provides a self-timed operation i.e., SRAMVcc is collapsed with a feedback operation which ensures its stable level while reducing overall power consumption of architecture 200 (also called write assist circuit). In one embodiment, architecture 200 comprises logic 201 to control a pull-up device MP1; logic 202 to control pull-down device MN1; Hysteresis Circuit 203; and sleep transistor MP2. In one embodiment, logic 201 is a NAND gate which causes SRAMVcc (provided by Power supply node of FIG. 1) to be pull-up to Vcc power supply level during normal operation of memory cell(s) 104. In one embodiment, logic 201 receives SRAMVccWake signal and SRAMVccPulse_b signal (i.e., logical inverse of SRAMVccPulse signal) to generate Wake_b signal to turn on or off p-type device MP1. SRAMVccWake signal indicates when SRAMVcc should be substantially close to Vcc level e.g., when memory cell(s) 104 are not in sleep state. SRAMVccPulse signal is a pulse signal having a duration indicating when memory cell(s) are in sleep mode.

In one embodiment, logic 202 and MN1 form device 101 of FIG. 1. While in this embodiment, MN1 is coupled to Power supply node and ground, the ground terminal can be replaced with another node. For example, the other node may be a capacitive node, or a node having voltage potential lower than Vcc, but higher than ground. In one embodiment, MN1 is replaced by a p-type device. In such an embodiment, logic 202 is conditioned to drive proper logic signal to the gate terminal of the p-type device to turn it on during write assist operation and to turn it off when write assist operation is over.

In one embodiment, logic 202 is a NOR gate that receives output (on Power supply local node) of Hysteresis Circuit 203 and SRAMVccPulse_b signal to generate Pulse signal to turn on/off MN1. In one embodiment, Hysteresis Circuit 203 (same as Feedback Unit 102 of FIG. 2) receives SRAMVcc as input and generates an output on Power supply local node according to Pulse signal from logic 202 and/or Fb Control signal. In one embodiment, Hysteresis Circuit 203 is operable to disable MN1 device when SRAMVcc reaches a targeted collapsed level. In such an embodiment, MP1 and p-type MP2 are off causing Power supply node to float. For example, a small capacitance (e.g., 50-100 fF) may be enough to maintain state of SRAMVcc on Power supply node when Power supply node is floating.

In one embodiment, collapse of SRAMVcc is initiated by a self-timed or synchronous SRAMVccPulse signal which enables MN1 (by enabling logic 202) and disables MP1 (via logic 201) and MP2. In one embodiment, Hysteresis Circuit 203 is a Schmitt-Trigger which is operable to disable MN1 after being triggered. Hysteresis Circuit 203 has an output state dependent trip point to prevent oscillations when input of Hysteresis Circuit 203 reaches a voltage level which is a tripping point of Hysteresis Circuit 203. In one embodiment, Hysteresis Circuit 203 receives Fb Control signal (e.g., bias signals) to adjust trip point of Hysteresis Circuit 203. In one embodiment, after Hysteresis Circuit 203 disables MN1, Hysteresis Circuit 203 provides immunity to ringing or oscillations as the threshold to re-enable MN1 is substantially higher than if a standard logic gate (e.g., CMOS inverter) were used instead of Hysteresis Circuit 203.

Figure 3:
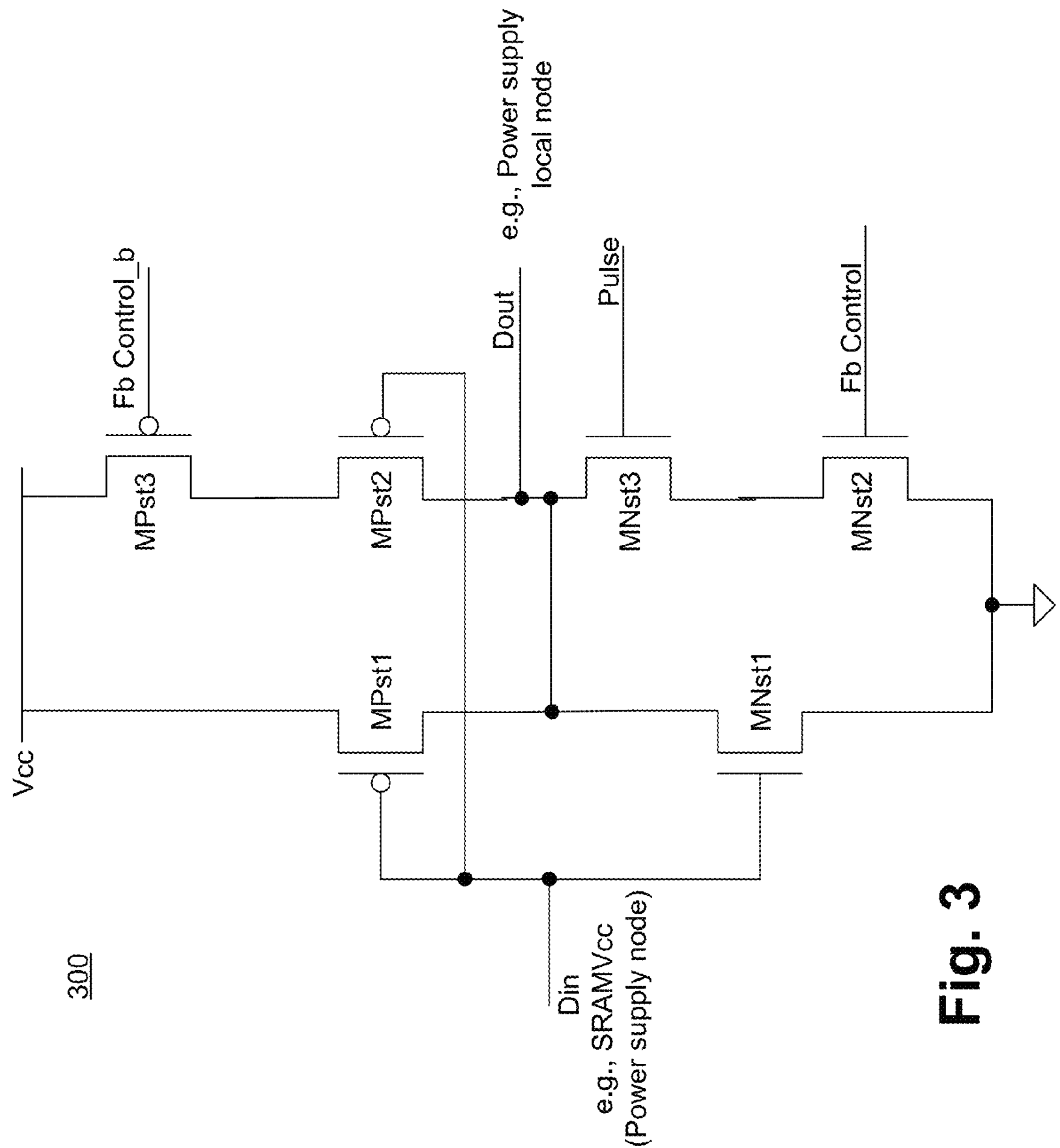
FIG. 3 is a programmable Schmitt Trigger used for implementing hysteresis for the circuit of FIG. 2, according to one embodiment of the disclosure.

FIG. 3 is a programmable Schmitt Trigger 300 used for implementing Hysteresis Circuit 203 of FIG. 2, according to one embodiment of the disclosure. It is pointed out that those elements of FIG. 3 having the same reference numbers (or names) as the elements of any other figure can operate or function in any manner similar to that described, but are not limited to such.

In one embodiment, Schmitt Trigger 300 comprises n-type device MNst1 coupled in series with p-type device MPst1 to form of an inverter, where gate terminals of MNst1 and MPst1 receive the same input Din (e.g., SRAMVcc on Power supply node). In one embodiment, source terminal of MPst1 is coupled to Vcc (power supply) and source terminal of MNst1 is coupled to ground. In one embodiment, Schmitt Trigger 300 comprises p-type MPst2 which is also driven by Din. In this embodiment, MPst2 is coupled in series with MPst3 and MNst3. In one embodiment, MPst3 is controllable by Fb control_b signal which can adjust the trip point of Schmitt Trigger 300. In one embodiment, source terminal of MPst3 is coupled to Vcc while drain terminal of MPst3 is coupled to source terminal of MPst2. In one embodiment, drain terminals of MPst1 and MPst2 are shorted together. In one embodiment, gate terminals of MNst2 and MPst3 are not necessarily of opposite polarity ("Fb Control_b" vs. "Fb Control"). In one embodiment, MNst2 and MPst3 are used to adjust Schmitt trigger trip points.

In one embodiment, source terminal of MPst2 is coupled to drain terminal of MNst3, where MNst3 is controlled by Pulse signal generated by logic 202. In one embodiment, drain terminals of MNst3, MPst2, MPst1, and MNst1 form the output node Dout (e.g., Power supply local node). In one embodiment, MNst2 is coupled in series with MNst3, where MNst2 receives Fb Control signal to adjust trip point of Schmitt Trigger 300. In one embodiment, MPst3 and/or MNst2 are multiple devices coupled together in parallel. In one embodiment, Fb Control and Fb Control_b are digital busses to turn on and/or off transistors labeled MPst3 and/or MNst2 to adjust current strength of Schmitt Trigger 300 to adjust trip point of Schmitt Trigger 300. In such an embodiment, Schmitt Trigger 300 is a digitally tunable hysteresis circuit.

Figure 4B:
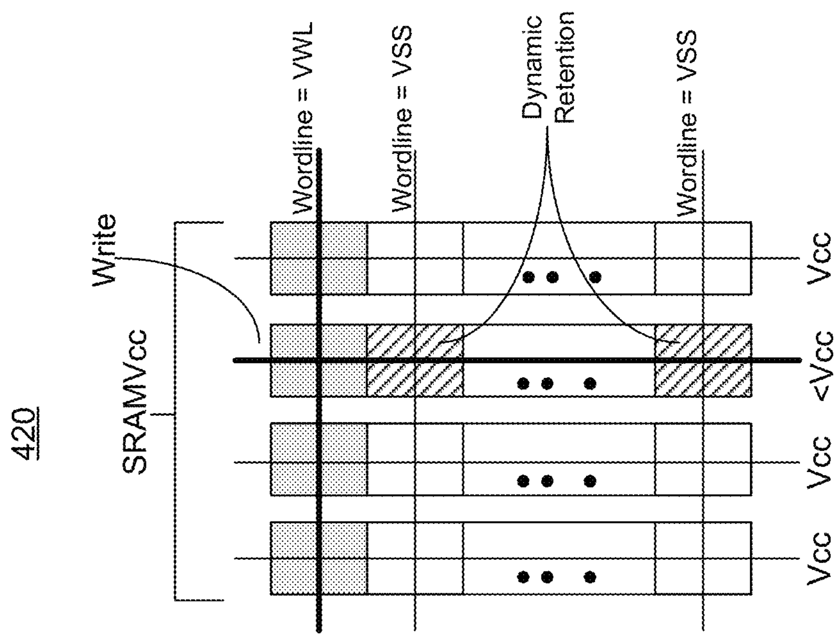
FIG. 4B is a memory array with columns of memory cells, in which one of the columns is selected for write operation and receives an adjusted power supply from the circuit of FIG. 1, according to one embodiment of the disclosure.
Figure 4A:
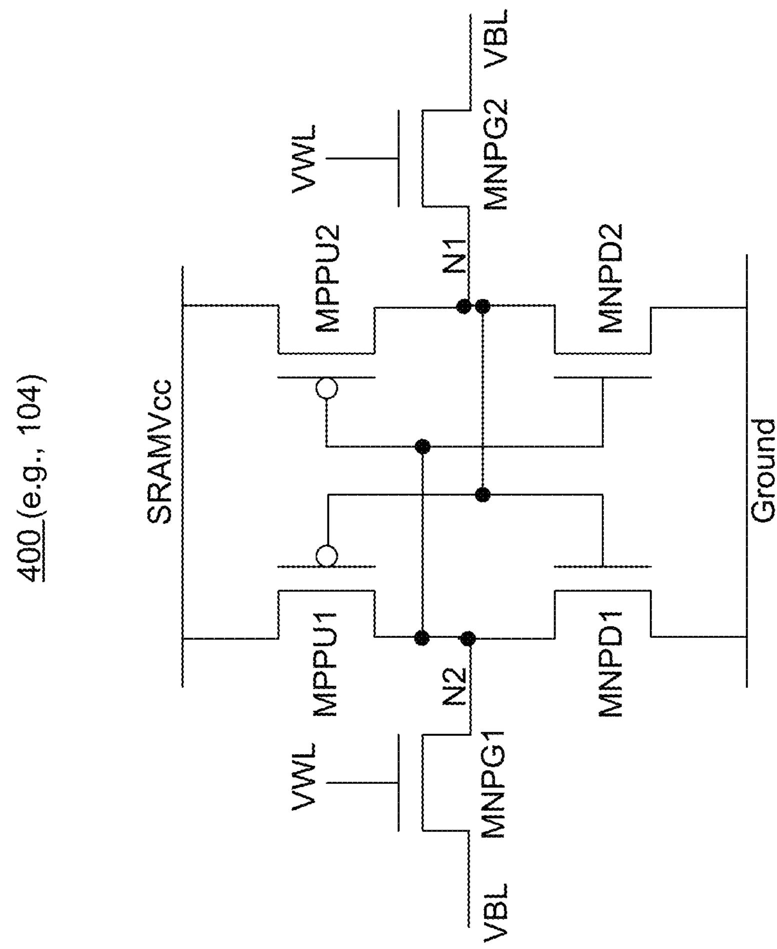
FIG. 4A is a 6T (six transistor) SRAM cell which receives the adjustable power supply from the circuit of FIG. 1, according to one embodiment of the disclosure.

FIG. 4A is a 6T (six transistor) SRAM cell 400 which receives the adjustable power supply (SRAMVcc) from the circuit of FIG. 1, according to one embodiment of the disclosure. It is pointed out that those elements of FIG. 4A having the same reference numbers (or names) as the elements of any other figure can operate or function in any manner similar to that described, but are not limited to such.

In one embodiment, SRAMVcc is coupled to source terminals of p-type pull-up devices MPPU1 and MPPU2. MPPU1 and n-type MNPD1 form a first inverter while MPPU2 and n-type MNPD2 form a second inverter which is cross-coupled to the first inverter, where MNPD1 and MNPD2 form the pull-down devices of SRAM 400. In one embodiment, output N2 of first inverter is coupled to first access transistor MNPG1 and to input node of second inverter (i.e., gate terminals of MPPU2 and MNPD2). In one embodiment, first access transistor MNPG1 is controllable by wordline signal VWL which is received by gate terminal of MNPG1. MNPG1 is coupled to nodes N2 and VBL, where VBL provides the bitline signal. In one embodiment, output N1 of second inverter is coupled to second access transistor MNPG2 and to input node of first inverter (i.e., gate terminals of MPPU1 and MNPD1). In one embodiment, second access transistor MNPG2 is controllable by wordline signal VWL which is received by gate terminal of MNPG2. MNPG2 is coupled to nodes N1 and VBL, where VBL provides the bitline signal.

In one embodiment, during write operation, SRAMVcc for memory cell 400 is collapsed by the circuits of FIGS. 1, 2, and/or 6 to reduce contention between access transistors (MNPG1 and MNPG2) and pull-up devices (MPPU1 and MPPU2). In one embodiment, during read operation, SRAMVcc for memory cell 400 is allowed to be substantially the same as Vcc. One technical effect of such collapsing of SRAM Vcc is that it improves write operation without impacting read operation.

FIG. 4B is a memory array 420 with columns of memory cells, in which one of the columns is selected for write operation and receives an adjusted power supply (SRAMVcc) from the circuit of FIG. 1, according to one embodiment of the disclosure. It is pointed out that those elements of FIG. 4B having the same reference numbers (or names) as the elements of any other figure can operate or function in any manner similar to that described, but are not limited to such.

In this example, memory array 420 has four columns of memory cells, where each column has a plurality of memory cells. The third column from the left is selected for write operation and the cell to be written is the shaded cell in the top row of the third column, which is shown by the cross-section of the two bold lines. The horizontal lines are the wordlines for each row. The row which is to be written has the bold horizontal line which wordline set to VWL voltage while other unselected wordlines are set to Vss. The memory cells in the third column which are unselected are shown by pattern shades. These are the memory cells which retain their memory while the memory cell in the top row of the third column is being written to. In this exemplary embodiment, SRAMVcc for all unselected columns (first, second, and fourth columns from the left) remain at Vcc while SRAMVcc for the selected cell is collapsed by the circuits of FIGS. 1, 2, and/or 6 to reduce contention between access transistors (MNPG1 and MNPG2) and pull-up devices (MPPU1 and MPPU2).

Figures 5A, 5B:
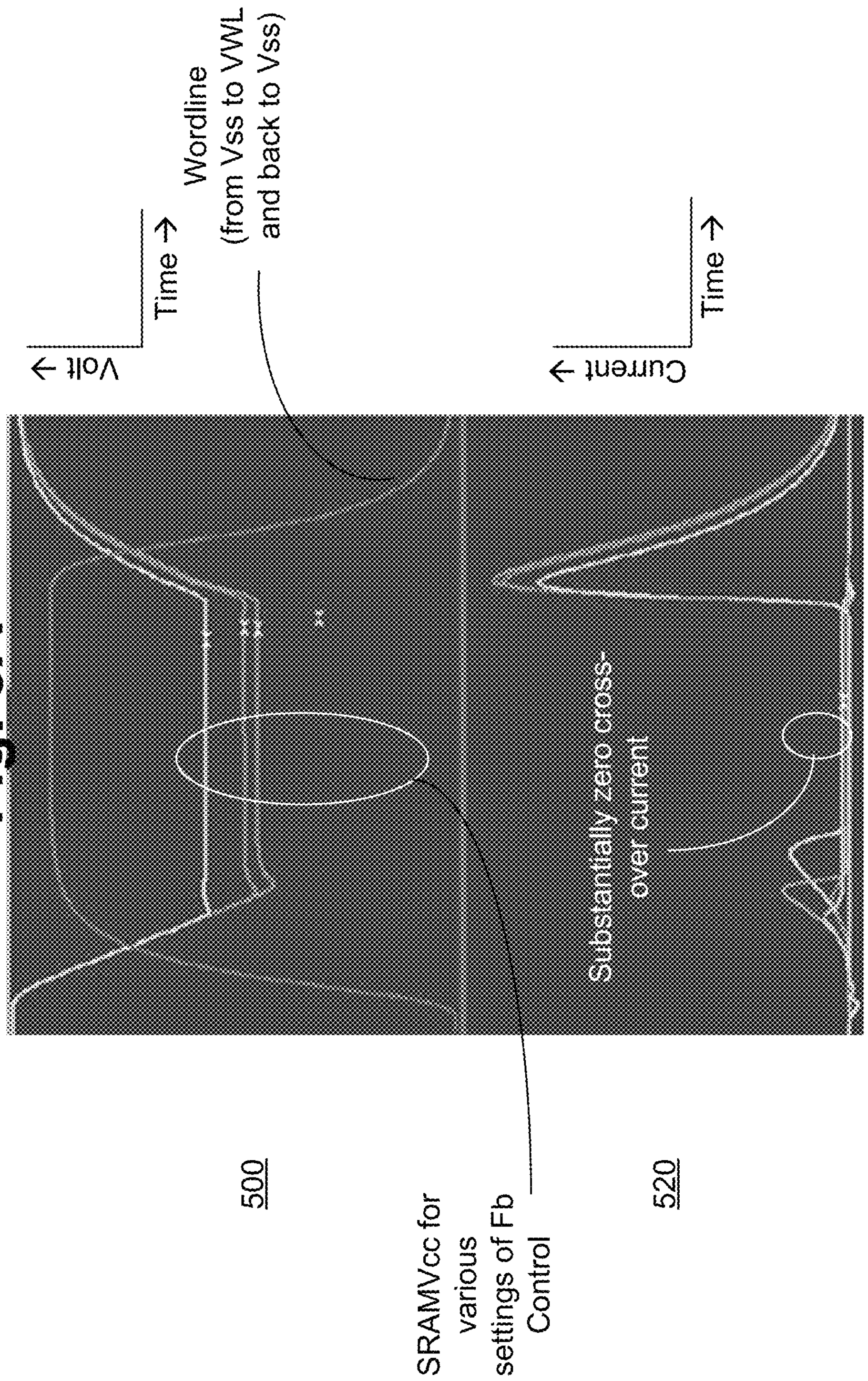
FIGS. 5A-B are plots showing operation of circuit of FIGS. 1-2 with negligible (or zero) cross-over current power consumption during power supply collapse operation, according to one embodiment.

FIGS. 5A-B are plots showing operation of circuit of FIGS. 1-2 with negligible (or zero) static power consumption during power supply collapse operation, according to one embodiment. It is pointed out that those elements of FIGS. 5A-B having the same reference numbers (or names) as the elements of any other figure can operate or function in any manner similar to that described, but are not limited to such.

FIG. 5A shows plot 500 where x-axis is time and y-axis is voltage. Plot 500 shows that as wordline is selected for a column of memory cells i.e., wordline transitions from Vss (ground) to VWL (high voltage), then write operation is performed. During write operation, SRAMVcc is collapsed to a level lower than Vcc so as not to lose the content of the memory cell, and yet assist with write operation with low power consumption. Here, the multiple levels of SRAMVcc are achieved by adjusting the levels or bits of Fb Control signal.

For example, Fb Control signal received by Schmitt-Trigger 300 adjusts the trip point of Schmitt-Trigger 300 and thus the SRAMVcc level. In this example, as wordline transitions from VWL to Vss, write operation ends and SRAMVcc is allowed to operate at its normal level (via p-type device MP1) which is substantially close to Vcc.

FIG. 5B is a plot 520 where x-axis is time and y-axis is current. Plot 520 illustrates the cross-over current consumption of circuit of FIG. 2, which is substantially zero during write assist operation i.e., when SRAMVcc is being collapsed. This is contrary to traditional write assist circuits which continue to consume substantial cross-over current during SRAMVcc collapse during write operation.

Figure 6:
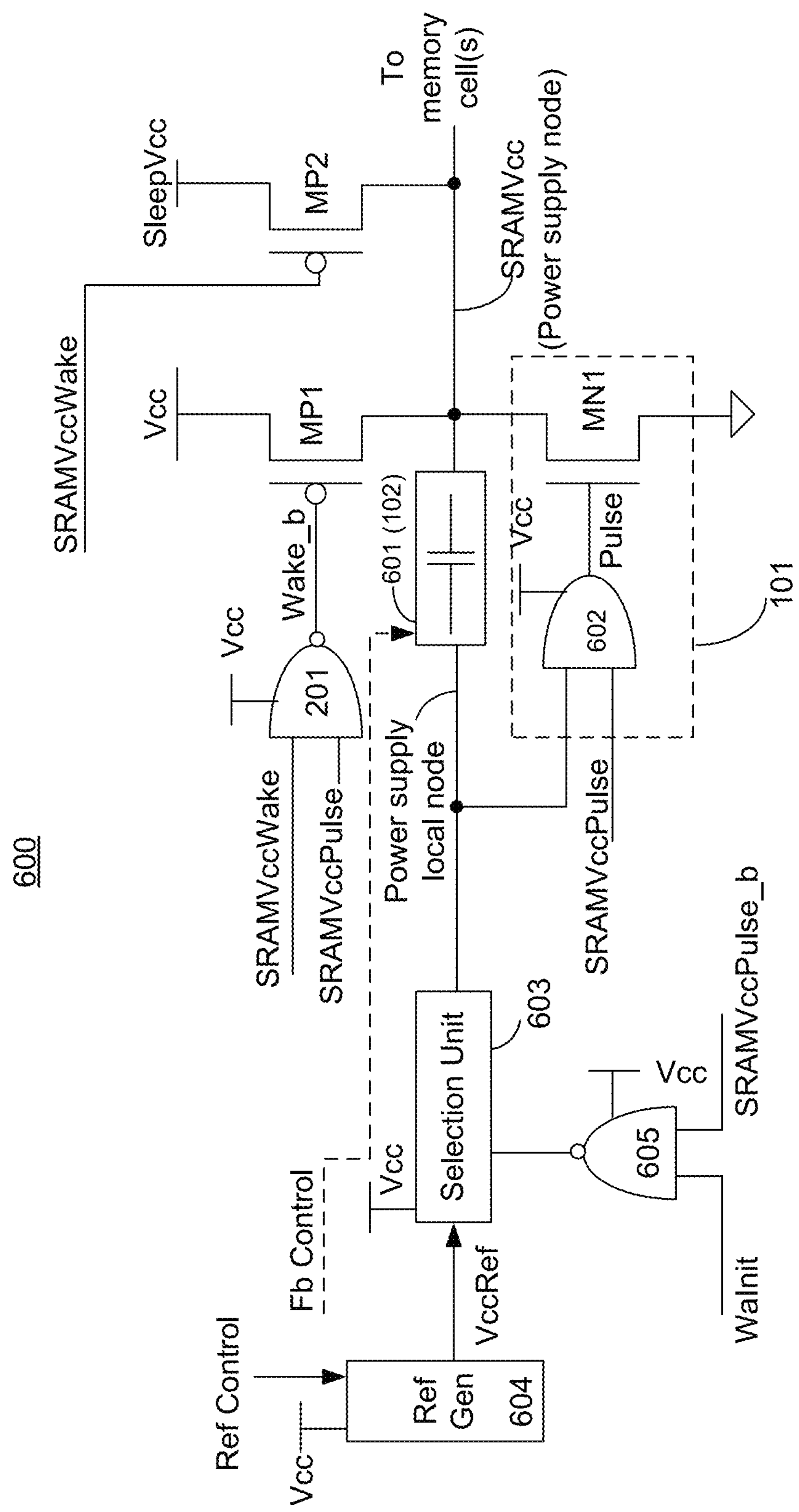
FIG. 6 is a circuit implementation of capacitor based architecture for adjusting power supply to memory cell(s) during write operation, according to one embodiment of the disclosure.

FIG. 6 is a circuit implementation of capacitor based architecture 600 for adjusting power supply to memory cell(s) during write operation, according to one embodiment of the disclosure. It is pointed out that those elements of FIG. 6 having the same reference numbers (or names) as the elements of any other figure can operate or function in any manner similar to that described, but are not limited to such.

In one embodiment, architecture 600 extends the range of tunable SRAMVcc collapse voltage levels without significant cross-over current or large power consumption. So as not to obscure the embodiment, circuit components discussed with reference to FIGS. 1-2 are not described again with reference to architecture 600.

In one embodiment, architecture 600 comprises capacitor 601 (e.g., feedback unit 102), device 101 having logic gate 602 and transistor MN1, selection unit 603, reference generator 604, and logic gate 605. In one embodiment, capacitor 601 is a transistor capacitor. For example, capacitor 601 is a p-type or n-type device with its gate terminal coupled to Power supply local node and source and drain terminals coupled together and to Power supply node. In one embodiment, capacitor 601 is a metal capacitor. In another embodiment, capacitor 601 is a hybrid capacitor i.e., capacitor formed from p-type or n-type device and metal capacitor. In one embodiment, capacitor 601 behaves like a voltage level-shifter. In one embodiment, Power supply local node voltage is equal to voltage on Power supply node minus voltage across capacitor 601, so it is a voltage shifted downwards.

In one embodiment, selection unit 603 is a pass-gate that allows Power supply local node to float or be driven by VccVref according to an output of logic 605. In one embodiment, Power supply local node is pre-charged to VccRef before write operation. In one embodiment, logic 605 is a NAND gate which performs NAND operation between SRAMVccPulse_b (i.e., inverted version of SRAMVccPulse) and WaInit (i.e., write assist initialization signal). In one embodiment, WaInit signal is used to activate Selection Unit 603 and drive the coupled node (i.e., Power supply local node) to a mid-Vcc voltage.

In other embodiments, NAND gate 605 can be replaced with any other logic gate to perform the desired function described in the embodiments. In one embodiment, selection unit 603 comprises any other selection circuit that allows Power supply local node to float or receive VccRef in response to a control signal (e.g., output of NAND gate 605).

In one embodiment, VccRef is generated by Reference Generator (Ref Gen) 604. In one embodiment, Ref Gen 604 is a voltage divider circuit with selectable voltages i.e., selectable by Ref Control signal. In one embodiment, the collapsed voltage level of SRAMVcc depends on the voltage level of VccRef. In one embodiment, Ref Control is a bus with several bits (e.g., 7 bits) used to control resistor divider network to provide a tunable collapse SRAMVcc level e.g., tunable between Vcc range of 0 to 80% at Vcc of 0.75V.

In one embodiment, logic 602 performs an AND operation between the signal on Power supply local node and SRAMVccPulse signal to generate Pulse signal which controls pull-down device MN1. In one embodiment, architecture 600 biases the input to AND gate 602 below Vcc (using VccRef) before the collapse begins and then floats the biased node (i.e., Power supply local node) allowing capacitor 601, coupled to the Power supply node (providing SRAMVcc), to couple the node low and trigger logic 602 to disable pull-down device MN1.

In one embodiment, by biasing Power supply local node below Vcc, the disabling path (i.e., logic path having AND gate 602 and pull-down device MN1) clamps SRAMVcc to float at voltages equal to switching voltage threshold of AND gate 602. In one embodiment, AND gate 602 may be replaced with any other logic unit that performs the intended purpose of the embodiments. In one embodiment, the arriving edge of SRAMVccPulse, which triggers the pull-down device MN1 via Pulse signal, also disables selection unit 603 to float Power supply local node.

In one embodiment, the time constant of feedback loop (i.e., loop from Power supply node through capacitor 601, logic 602, pull-down device MN1 and back to Power supply node) versus discharge rate of SRAMVcc limits the upper end of the voltage clamping range. For example, a weaker MN1 device or larger load on Power supply node may allow a voltage level greater than a high percentage of Vcc (e.g., 80% of Vcc) on Power supply node. In such an embodiment, architecture 600 allows for enhanced capability to tune SRAMVcc voltage levels with tradeoff of power consumption.

Figure 7:
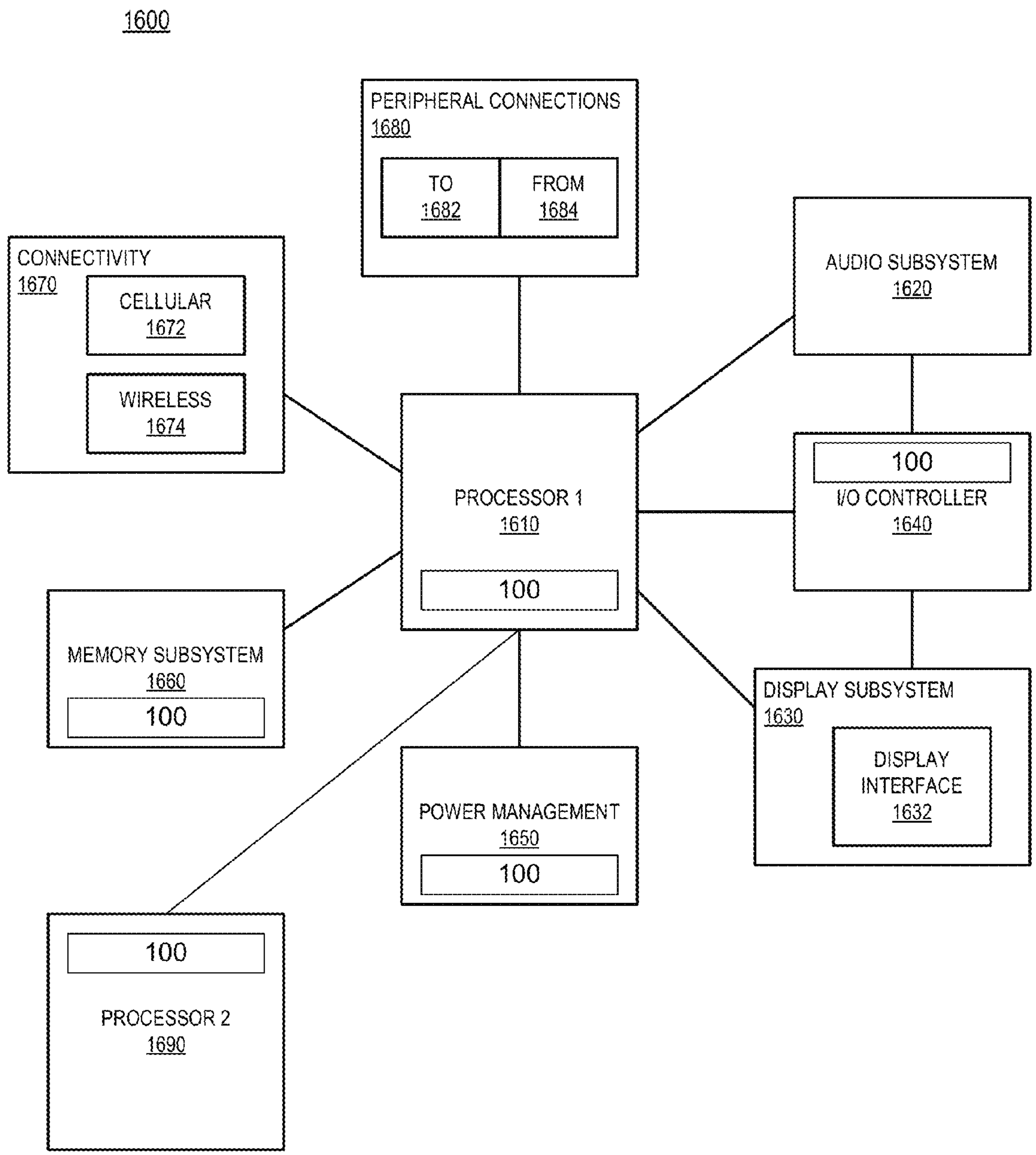
FIG. 7 is a smart device or a computer system or an SoC (system-on-chip) including low power write operation power supply adjustment circuit of FIG. 1, according to one embodiment of the disclosure.

FIG. 7 is a smart device or a computer system or an SoC (system-on-chip) including low power write operation power supply adjustment circuit of FIGS. 1-6, according to one embodiment of the disclosure. It is pointed out that those elements of FIG. 7 having the same reference numbers (or names) as the elements of any other figure can operate or function in any manner similar to that described, but are not limited to such.

FIG. 7 illustrates a block diagram of an embodiment of a mobile device in which flat surface interface connectors could be used. In one embodiment, computing device 1600 represents a mobile computing device, such as a computing tablet, a mobile phone or smart-phone, a wireless-enabled e-reader, or other wireless mobile device. It will be understood that certain components are shown generally, and not all components of such a device are shown in computing device 1600.

In one embodiment, computing device 1600 includes a first processor 1610 with circuit 100, according to the embodiments discussed. Other blocks of the computing device 1600 may also include circuit 100. The various embodiments of the present disclosure may also comprise a network interface within 1670 such as a wireless interface so that a system embodiment may be incorporated into a wireless device, for example, cell phone or personal digital assistant.

In one embodiment, processor 1610 (and processor 1690) can include one or more physical devices, such as microprocessors, application processors, microcontrollers, programmable logic devices, or other processing means. The processing operations performed by processor 1610 include the execution of an operating platform or operating system on which applications and/or device functions are executed. The processing operations include operations related to I/O (input/output) with a human user or with other devices, operations related to power management, and/or operations related to connecting the computing device 1600 to another device. The processing operations may also include operations related to audio I/O and/or display I/O.

In one embodiment, computing device 1600 includes audio subsystem 1620, which represents hardware (e.g., audio hardware and audio circuits) and software (e.g., drivers, codecs) components associated with providing audio functions to the computing device 1600. Audio functions can include speaker and/or headphone output, as well as microphone input. Devices for such functions can be integrated into computing device 1600, or connected to the computing device 1600. In one embodiment, a user interacts with the computing device 1600 by providing audio commands that are received and processed by processor 1610.

Display subsystem 1630 represents hardware (e.g., display devices) and software (e.g., drivers) components that provide a visual and/or tactile display for a user to interact with the computing device 1600. Display subsystem 1630 includes display interface 1632, which includes the particular screen or hardware device used to provide a display to a user. In one embodiment, display interface 1632 includes logic separate from processor 1610 to perform at least some processing related to the display. In one embodiment, display subsystem 1630 includes a touch screen (or touch pad) device that provides both output and input to a user.

I/O controller 1640 represents hardware devices and software components related to interaction with a user. I/O controller 1640 is operable to manage hardware that is part of audio subsystem 1620 and/or display subsystem 1630. Additionally, I/O controller 1640 illustrates a connection point for additional devices that connect to computing device 1600 through which a user might interact with the system. For example, devices that can be attached to the computing device 1600 might include microphone devices, speaker or stereo systems, video systems or other display devices, keyboard or keypad devices, or other I/O devices for use with specific applications such as card readers or other devices.

As mentioned above, I/O controller 1640 can interact with audio subsystem 1620 and/or display subsystem 1630. For example, input through a microphone or other audio device can provide input or commands for one or more applications or functions of the computing device 1600. Additionally, audio output can be provided instead of, or in addition to display output. In another example, if display subsystem 1630 includes a touch screen, the display device also acts as an input device, which can be at least partially managed by I/O controller 1640. There can also be additional buttons or switches on the computing device 1600 to provide I/O functions managed by I/O controller 1640.

In one embodiment, I/O controller 1640 manages devices such as accelerometers, cameras, light sensors or other environmental sensors, or other hardware that can be included in the computing device 1600. The input can be part of direct user interaction, as well as providing environmental input to the system to influence its operations (such as filtering for noise, adjusting displays for brightness detection, applying a flash for a camera, or other features).

In one embodiment, computing device 1600 includes power management 1650 that manages battery power usage, charging of the battery, and features related to power saving operation. Memory subsystem 1660 includes memory devices for storing information in computing device 1600. Memory can include nonvolatile (state does not change if power to the memory device is interrupted) and/or volatile (state is indeterminate if power to the memory device is interrupted) memory devices. Memory subsystem 1660 can store application data, user data, music, photos, documents, or other data, as well as system data (whether long-term or temporary) related to the execution of the applications and functions of the computing device 1600.

Elements of embodiments are also provided as a machine-readable medium (e.g., memory 1660) for storing the computer-executable instructions (e.g., instructions to implement any other processes discussed herein). The machine-readable medium (e.g., memory 1660) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity 1670 includes hardware devices (e.g., wireless and/or wired connectors and communication hardware) and software components (e.g., drivers, protocol stacks) to enable the computing device 1600 to communicate with external devices. The computing device 1600 could be separate devices, such as other computing devices, wireless access points or base stations, as well as peripherals such as headsets, printers, or other devices.

Connectivity 1670 can include multiple different types of connectivity. To generalize, the computing device 1600 is illustrated with cellular connectivity 1672 and wireless connectivity 1674. Cellular connectivity 1672 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 1674 refers to wireless connectivity that is not cellular, and can include personal area networks (such as Bluetooth, Near Field, etc.), local area networks (such as Wi-Fi), and/or wide area networks (such as WiMax), or other wireless communication.

Peripheral connections 1680 include hardware interfaces and connectors, as well as software components (e.g., drivers, protocol stacks) to make peripheral connections. It will be understood that the computing device 1600 could both be a peripheral device ("to" 1682) to other computing devices, as well as have peripheral devices ("from" 1684) connected to it. The computing device 1600 commonly has a "docking" connector to connect to other computing devices for purposes such as managing (e.g., downloading and/or uploading, changing, synchronizing) content on computing device 1600. Additionally, a docking connector can allow computing device 1600 to connect to certain peripherals that allow the computing device 1600 to control content output, for example, to audiovisual or other systems.

In addition to a proprietary docking connector or other proprietary connection hardware, the computing device 1600 can make peripheral connections 1680 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. For example, other memory architectures e.g., Dynamic RAM (DRAM) may use the embodiments discussed. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

For example, an apparatus comprises: a power supply node; a device operable to adjust voltage on the power supply node; and a feedback unit coupled to the power supply node, the feedback unit to control the device in response to a voltage level of the voltage on the power supply node. In one embodiment, the device is coupled to the power supply node and another node. In one embodiment, the other node is at least one of: a ground node; a capacitive load; or a node with a voltage potential lower than a power supply voltage.

In one embodiment, the device is at least one of: a p-type device; or an n-type device. In one embodiment, the feedback unit comprises a circuit with hysteresis. In one embodiment, the circuit with hysteresis comprises a Schmitt-trigger which includes a device which is operable to adjust tripping point of the Schmitt-trigger. In one embodiment, the feedback unit comprises at least one of: a capacitor; or a wire. In one embodiment, the capacitor is at least one of: a metal capacitor; a device capacitor; or a hybrid capacitor including a metal capacitor and a device capacitor. In one embodiment, one terminal of the capacitor is coupled to the power supply node, and wherein another terminal of the capacitor is operable to couple to a reference voltage or to a floating node.

In one embodiment, the apparatus further comprises a reference generator to provide the reference voltage. In one embodiment, the reference generator is operable to adjust voltage levels of the reference voltage. In one embodiment, the apparatus further comprises a memory cell coupled to the power supply node. In one embodiment, the memory cell is an SRAM cell.

In another example, an apparatus comprises: a power supply node; a pull-down device operable to pull down voltage on the power supply node; and a Schmitt-Trigger coupled to the power supply node, the Schmitt-Trigger to control the pull-down device in response to a voltage level of the voltage on the power supply node. In one embodiment, the apparatus further comprises: a logic gate coupled to an output of the Schmitt-Trigger, the logic gate having an output for controlling the pull-down device, wherein the logic gate to receive another input to enable or disable the logic gate.

In one embodiment, the Schmitt-Trigger is operable to adjust its tripping point. In one embodiment, the apparatus further comprises a memory cell coupled to the power supply node. In one embodiment, the memory cell is an SRAM cell. In one embodiment, the pull-down device is coupled to the power supply node and another node. In one embodiment, the other node is at least one of: a ground node; a capacitive load; or a node with a voltage potential lower than a power supply voltage. In one embodiment, the pull-down device is at least one of: a p-type device; or an n-type device.

In one embodiment, an apparatus comprises: a power supply node; an internal node operable to float or be driven by a reference signal; a pull-down device operable to pull down voltage on the power supply node; and a capacitor coupled to the power supply node and the internal node, the capacitor to indirectly control the pull-down device in response to a voltage level of the voltage on the power supply node.

In one embodiment, the apparatus further comprises a logic gate coupled to the internal node and the pull-down device. In one embodiment, the apparatus further comprises a reference generator to generate the reference signal. In one embodiment, the apparatus further comprises a select unit to couple the reference signal to the internal node in response to a control signal. In one embodiment, the select unit is a pass-gate. In one embodiment, the apparatus further comprises a memory cell coupled to the power supply node.

In one embodiment, the memory cell is an SRAM cell. In one embodiment, the pull-down device is coupled to the power supply node and another node. In one embodiment, the other node is at least one of: a ground node; a capacitive load; or a node with a voltage potential lower than a power supply voltage. In one embodiment, the pull-down device is at least one of: a p-type device; or an n-type device.

In another example, a system comprises: a wireless interface, a processor operable to communicate with another device using the wireless interface, the processor including an apparatus as discussed above; and a display unit to display content processed by the processor.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An apparatus comprising:
- a power supply node;
- a device operable to adjust voltage on the power supply node;
- a feedback unit coupled to the power supply node, the feedback unit to control the device in response to a voltage level of the voltage on the power supply node, wherein the feedback unit comprises a capacitor; and
- a logic unit coupled to the feedback unit to generate a feedback control signal to control the feedback unit.

2. The apparatus of claim 1, wherein the device is coupled to the power supply node and another node, and wherein the other node is at least one of:
- a ground node;
- a capacitive load; or a node with a voltage potential lower than a power supply voltage.

3. The apparatus of claim 2, wherein the device is at least one of:

a p-type device; or an n-type device.

4. The apparatus of claim 1, wherein the feedback unit comprises a circuit with hysteresis.

5. The apparatus of claim 4, wherein the circuit with hysteresis comprises a Schmitt-trigger which includes a device which is operable to adjust tripping point of the Schmitt-trigger base on the feedback control signal.

6. The apparatus of claim 1, wherein the capacitor is at least one of:

a metal capacitor;

a non-metal capacitor; or a hybrid capacitor including a metal capacitor and a device capacitor.

7. The apparatus of claim 1, wherein one terminal of the capacitor is connected to the power supply node, and wherein another terminal of the capacitor is operable to couple to a reference voltage or to a floating node.

8. The apparatus of claim 1 further comprises a memory cell coupled to the power supply node.

9. An apparatus comprising:

a power supply node;

an internal node operable to float or be driven by a reference signal;

a pull-down device operable to pull down voltage on the power supply node; and a capacitor having a the first terminal connected to the power supply node and a second terminal connected to the internal node, the capacitor to indirectly control the pull-down device in response to a voltage level of the voltage on the power supply node.

10. The apparatus of claim 9 further comprises a logic gate coupled to the internal node and the pull-down device.

11. The apparatus of claim 9 further comprises:

a reference generator to generate the reference signal; and a select unit to couple the reference signal to the internal node in response to a control signal.

12. The apparatus of claim 11, wherein the select unit is a pass-gate.

13. The apparatus of claim 9 further comprises a memory cell coupled to the power supply node.

14. The apparatus of claim 9, wherein the pull-down device is coupled to the power supply node and another node.

15. The apparatus of claim 14, wherein the another node is at least one of:

a ground node;

a capacitive load; or a node with a voltage potential lower than a power supply voltage.

16. The apparatus of claim 15, wherein the pull-down device is at least one of:

a p-type device; or an n-type device.

17. A system comprising:

a wireless interface;

a processor operable to communicate with another device using the wireless interface, the processor including:

a power supply node;

a device operable to adjust voltage on the power supply node;

a feedback unit coupled to the power supply node, the feedback unit to control the device in response to a voltage level of the voltage on the power supply node, wherein the feedback unit comprises a capacitor; and a logic unit coupled to the feedback unit to generate a feedback control signal to control the feedback unit; and a display unit to display content processed by the processor.

18. The system of claim 17, wherein the device is coupled to the power supply node and another node, and wherein the other node is at least one of:

a ground node;

a capacitive load; or a node with a voltage potential lower than a power supply voltage.

19. The apparatus of claim 18, wherein the device is at least one of:

a p-type device; or an n-type device.

* * * * *